(12) United States Patent
Gan

(10) Patent No.: US 10,824,031 B2
(45) Date of Patent: Nov. 3, 2020

(54) MANUFACTURING METHOD OF AN ARRAY SUBSTRATE COMPRISING A SOURCE ELECTRODE, A DRAIN ELECTRODE, AND A PIXEL ELECTRODE THAT ARE CONFIGURED TO BE DIRECTLY EXPOSED WITHIN A LIQUID CRYSTAL LAYER

(71) Applicant: Shenzhen China Star Optoelectronics Semiconductor Display Technology Co., Ltd., Guangdong (CN)

(72) Inventor: Qiming Gan, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 266 days.

(21) Appl. No.: 15/739,712

(22) PCT Filed: Jul. 21, 2017

(86) PCT No.: PCT/CN2017/093822
§ 371 (c)(1),
(2) Date: Dec. 23, 2017

(87) PCT Pub. No.: WO2018/223497
PCT Pub. Date: Dec. 13, 2018

(65) Prior Publication Data
US 2018/0350850 A1 Dec. 6, 2018

(51) Int. Cl.
*G02F 1/1343* (2006.01)
*H01L 27/12* (2006.01)
(Continued)

(52) U.S. Cl.
CPC ........ *G02F 1/13439* (2013.01); *G02F 1/1362* (2013.01); *G02F 1/1368* (2013.01);
(Continued)

(58) Field of Classification Search
CPC ......... G02F 2001/136231; G02F 2001/136295
See application file for complete search history.

(56) References Cited

U.S. PATENT DOCUMENTS

| 6,678,017 B1 * | 1/2004 | Shimomaki ......... G02F 1/13452 349/139 |
| 2004/0135944 A1 * | 7/2004 | Kim .................. G02F 1/133514 349/113 |

(Continued)

FOREIGN PATENT DOCUMENTS

| CN | 102629581 A | 8/2012 |
| CN | 106024809 A | 10/2016 |

*Primary Examiner* — Paul C Lee
(74) *Attorney, Agent, or Firm* — Leong C. Lei

(57) ABSTRACT

The present disclosure relates to an array substrate and the manufacturing method thereof, and a liquid crystal panel. The method includes forming a first metal substrate on a substrate; adopting a first mask to etch the first metal substrate to form a gate; forming a gate insulation layer, an active layer, and a second metal layer on the first metal layer in sequence; and adopting a second mask to etch the second metal layer and the active layer to form a source, a drain, and a pixel electrode. In this way, only two masks are adopted in the manufacturing process. Thus, the manufacturing process is enhanced, and the cost of the product is reduced.

7 Claims, 6 Drawing Sheets

(51) Int. Cl.
*G02F 1/1368* (2006.01)
*G02F 1/1362* (2006.01)

(52) U.S. Cl.
CPC .... *G02F 1/136286* (2013.01); *H01L 27/1288* (2013.01); *G02F 2001/136231* (2013.01); *G02F 2001/136295* (2013.01); *G02F 2201/123* (2013.01)

(56) References Cited

U.S. PATENT DOCUMENTS

| | | | |
|---|---|---|---|
| 2007/0264735 A1* | 11/2007 | Byun | H01L 27/1288 438/30 |
| 2014/0008655 A1* | 1/2014 | Chen | G02F 1/136227 257/59 |
| 2015/0323835 A1 | 11/2015 | Hui et al. | |

\* cited by examiner

MANUFACTURING METHOD OF AN ARRAY SUBSTRATE COMPRISING A SOURCE ELECTRODE, A DRAIN ELECTRODE, AND A PIXEL ELECTRODE THAT ARE CONFIGURED TO BE DIRECTLY EXPOSED WITHIN A LIQUID CRYSTAL LAYER

BACKGROUND OF THE INVENTION

1. Field of the Invention

The present disclosure relates to display technology, and more particularly to an array substrate and the method thereof, and a liquid crystal panel.

2. Discussion of the Related Art

Display technology has been developed to enhance the performance and to reduce the manufacturing cost, along with the enhancement of a variety of manufacturing methods and precision. In addition, the dimension of the pixel has been designed to be smaller and smaller. The enhancement not only relates to high contrast or brightness, but also the viewing angle and the color space.

Among the display technologies, vertical alignment is a very a good solution. However, with respect to conventional VA manufacturing process, at least four manufacturing processes are needed, which includes M1 (first metal layer), an active layer, a M2 (second metal layer), a PV (organic layer), and a pixel electrode. Regarding mass production, the cost may be higher. It can be understood that the manufacturing cost may be reduced by decreasing the number of the manufacturing processes.

SUMMARY

The present disclosure relates to an array substrate and the manufacturing method thereof, and a liquid crystal panel, wherein two masks are needed during the manufacturing process of the array substrate. This not only enhances the manufacturing efficiency, but also reduces the manufacturing cost.

In one aspect, a manufacturing method of array substrates includes: forming a first metal substrate on a substrate; adopting a first mask to etch the first metal substrate to form a gate; forming a gate insulation layer, an active layer, and a second metal layer on the first metal layer in sequence; and adopting a second mask to etch the second metal layer and the active layer to form a source, a drain, and a pixel electrode.

In another aspect, an array substrate includes: a first metal layer, a gate insulation layer, an active layer, and a second metal layer stacked in sequence; wherein the first metal layer comprises a gate, and the second metal comprises a source, a drain, and a pixel electrode.

In another aspect, a liquid crystal panel includes an array substrate, a CF substrate, a liquid crystal layer between the array substrate and the CF substrate, wherein the array substrate is formed by the above manufacturing method, and at least one common electrode is configured on the common electrode.

In view of the above, a first metal layer is formed on a substrate; adopting a first mask to etch the first metal layer to form a gate; a gate insulation layer, an active layer, and a second metal layer is formed on the first metal layer in sequence; adopting a second mask to etch the second metal layer and the active layer to form a source, a gate, and a pixel electrode. In this way, only two masks are needed in the manufacturing process of the array substrate, which enhances the efficiency of the manufacturing process and reduces the cost of the product.

DETAILED DESCRIPTION OF THE EMBODIMENTS

Embodiments of the invention will now be described more fully hereinafter with reference to the accompanying drawings, in which embodiments of the invention are shown.

Figure 1:
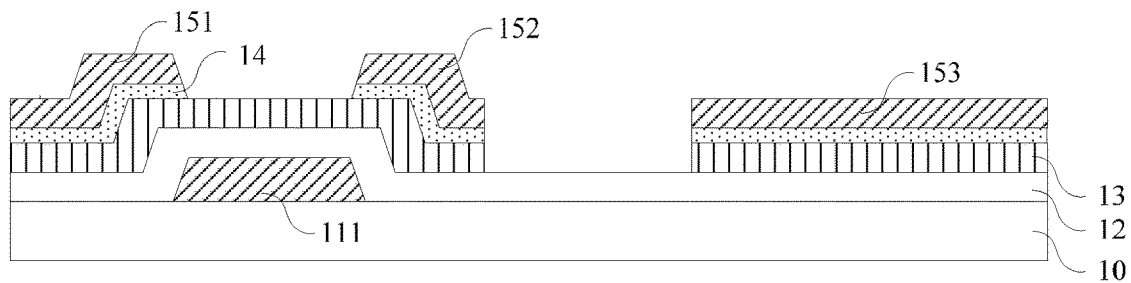
FIG. 1 is a schematic view of the array substrate in accordance with one embodiment of the present disclosure.

FIG. 1 is a schematic view of the array substrate in accordance with one embodiment of the present disclosure. The array substrate includes a first metal layer 11, a gate insulation layer 12, an active layer and a second metal layer 15 stacked on a substrate 10 in sequence.

The active layer includes a semiconductor layer 13 and an ion injection layer 14.

The first metal layer 11 includes a gate 111, and the second metal layer 15 includes a source 151, a drain 152, and a pixel electrode 153.

The first metal layer 11 is etched to form the gate 111 by a first mask, the second metal layer 15 is etched to form the source 151, the drain 152, and the pixel electrode 153 by a second mask.

The second metal layer 15 is an oxidation resistant metal layer and the second metal layer 15 is exposed within the liquid crystal layer between the array substrate and the color film substrate.

The manufacturing method of the array substrate will be described in accompany with the FIGS. 2 and 3-13.

Figure 2:
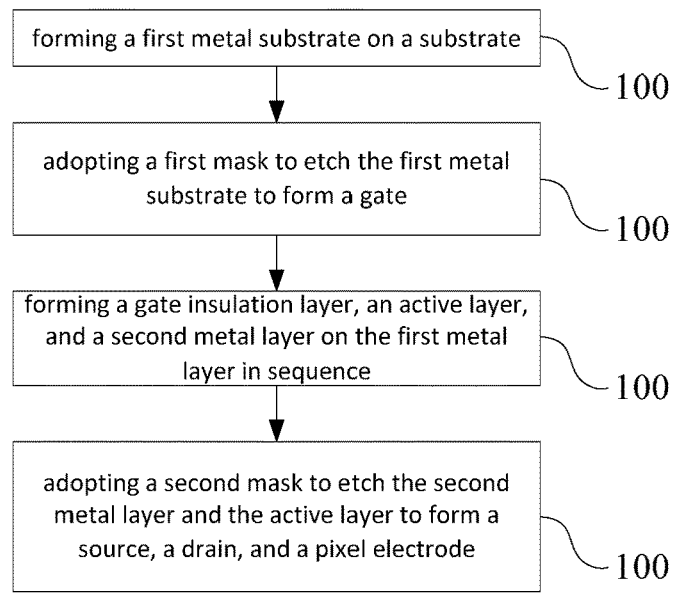
FIG. 2 is a flowchart illustrating the manufacturing method of the array substrate in accordance with one embodiment of the present disclosure.

As shown in FIG. 2, the manufacturing method of the array substrate includes the following steps.

In step S21, forming a first metal layer on a substrate.

In step S22, etching a first metal layer by a first mask to form a gate.

The substrate 10 may be a transparent glass substrate, or a transparent plastic substrate. The first metal layer may be one or a combination of Pt, Ru, Au, Ag, Mo, Cr, Al, Ta, Ti, or W.

Specifically, a metal layer may be deposited on the substrate 10 via Physical vapor deposition (PVD) or chemical vapor deposition (CVD). Specifically, one or a plurality of methods, such as a physical sputtering, a spin coating, an ink jet, a slit coating, or a photolithography process may be adopted.

Figure 3:
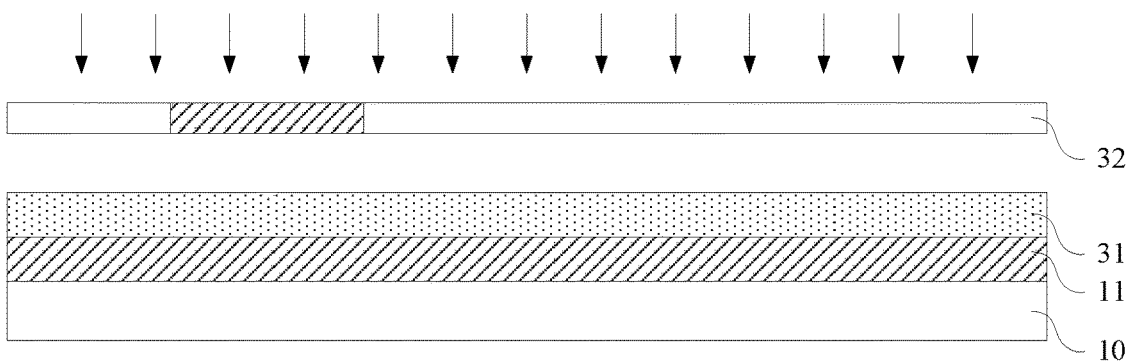
FIGS. 3-6 are schematic views of the steps S21-S22 of the manufacturing method in accordance with one embodiment of the present disclosure.
Figure 4:
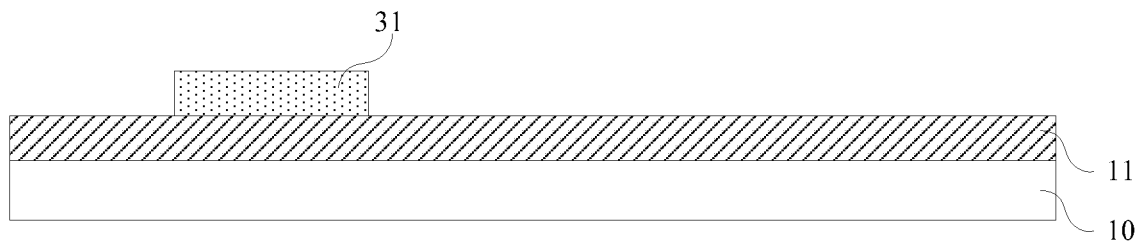
Figure 5:
Figure 6:

As shown in FIG. 3, after the metal has been deposited, photoresist glue 31 is coated on the first metal layer 11, and the photoresist glue 31 is applied with an exposure development by a first mask 32. The photoresist glue 31 after such process is shown in FIG. 4. Afterward, the first metal layer is etched to form the structure in FIG. 5. In the end, the photoresist glue 31 is peeled off to form the gate 111 in FIG. 6.

It is to be noted that, in the above manufacturing process, the gate 111 is formed by the same first metal layer 11 by using only one mask.

In step S23, forming a gate insulation layer, an active layer, and a second metal layer on the first metal layer in sequence.

Figure 7:
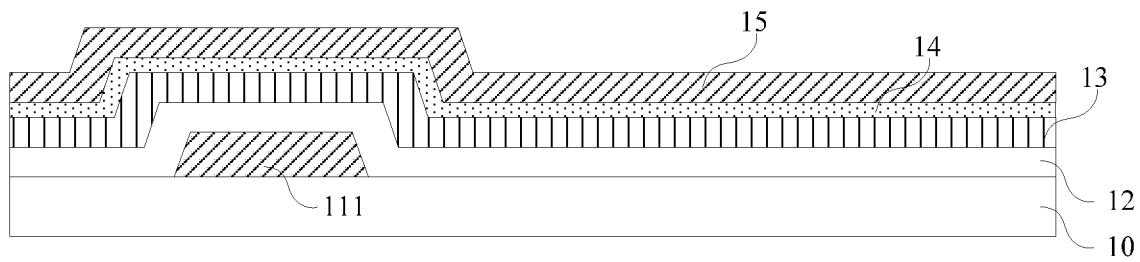
FIG. 7 is a schematic view of the step S23 of the manufacturing method in accordance with one embodiment of the present disclosure.

Specifically, as shown in FIG. 7, the gate insulation layer 12 is formed on the first metal layer 11. The semiconductor layer 13 is formed on the gate insulation layer 12. Ions are injection on a surface of the semiconductor layer 13 to form an ion injection layer 14. A second metal layer 15 is formed on the ion injection layer 14.

The gate insulation layer 12 may be SiOx, SiNx, or a mixture of the SiOx and the SiNx. The semiconductor layer 13 may be made by Si, Ge or GaAs. In one embodiment, the semiconductor layer 13 may be made by As. The ion injection layer 14 may be also called as the ion doping layer, which may be injected with different ions in accordance with the functions of the TFT. When a N-type semiconductor is demanded, phosphorus may be injected. When a P-type semiconductor is demanded, Boron and gallium may be injected.

When the array substrate and the CF substrate cooperatively define the liquid crystal cell, the second metal layer 15 is exposed so as to contact with the liquid crystal. Thus, the second metal layer 15 requires a multilayer structure metal formed of a combination of metals which are difficult to oxidize, such as Ag or Ag, Mo.

In step S24, adopting a second mask to etch the second metal layer and the active layer to form a source, a drain, and a pixel electrode.

Figure 8:
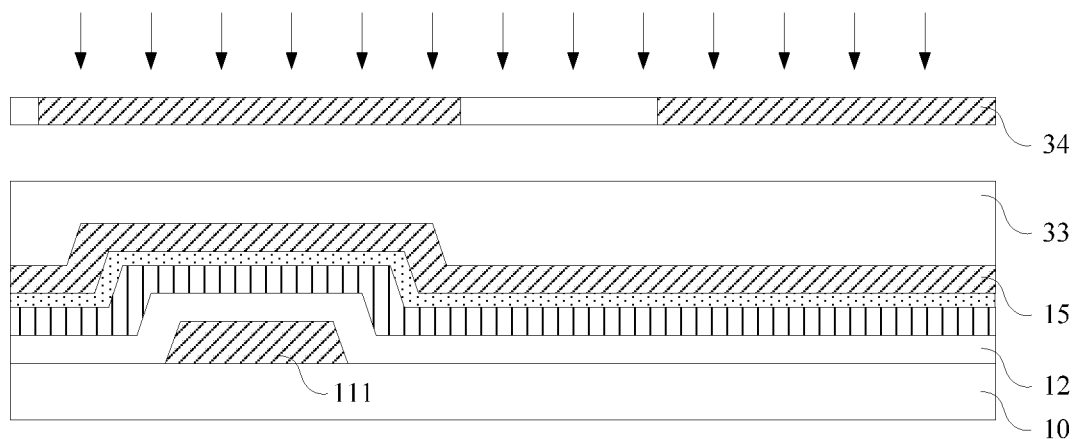
FIGS. 8-13 are schematic views of the step S24 of the manufacturing method in accordance with one embodiment of the present disclosure.
Figure 9:
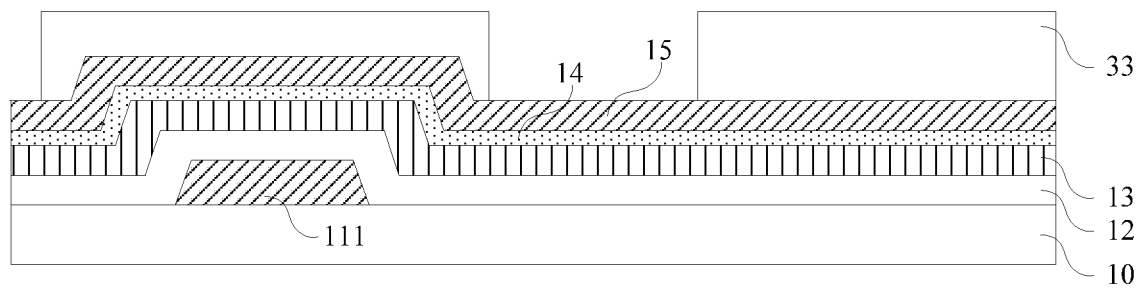

As shown in FIG. 8, the photoresist glue 33 is coated on the second metal layer 15. The photoresist glue 33 is then applied with the exposure and development process via a second mask. FIG. 9 is a schematic view of the photoresist glue 33 after being applied with the exposure and development process.

Afterward, the etching process is applied to the second metal layer 15, the semiconductor layer 13, and the ion injection layer 14 to form the source, the drain, and the pixel electrode.

Figure 10:
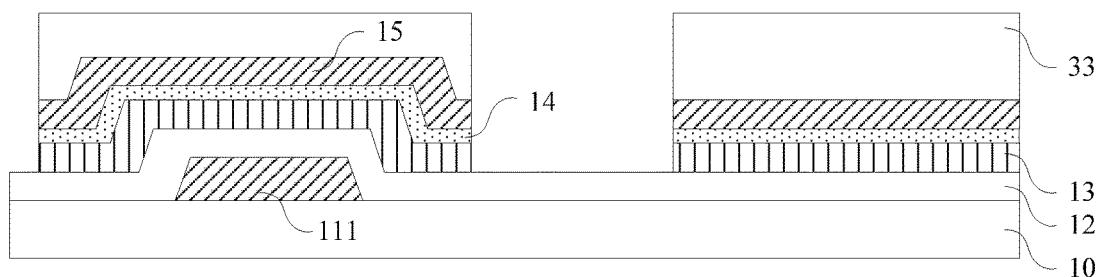

Specifically, as shown in FIG. 10, the etching process is applied to the portions of the second metal layer 15, the semiconductor layer 13, and the ion injection layer 14 that have not been covered by the photoresist glue 33 such that the portions that are not covered by the photoresist glue 33 are exposed to the gate insulation layer 12. In an example, when the second metal layer 15 is etched, the wet etching process may be adopted. The dry etching process is adopted to etch the semiconductor layer 13 and the ion injection layer 14.

Figure 11:
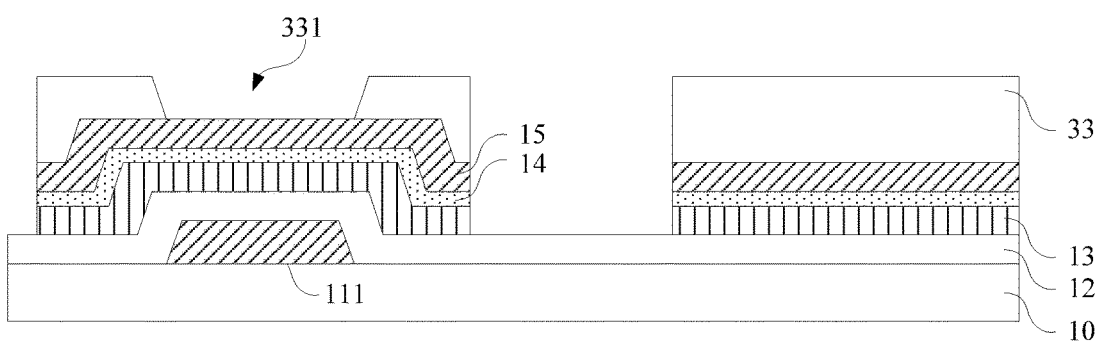
Figure 12:
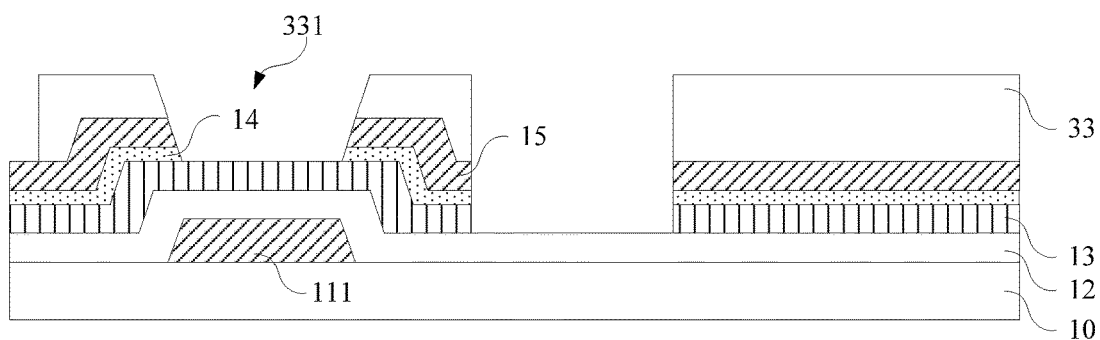

As shown in FIG. 11, digging a hole on the photoresist glue 33 to form a through hole 331 such that a portion of the second metal layer 15 covered by the photoresist glue 33 is exposed. Specifically, the exposed portion of the second metal layer 15 corresponds to the gate 111. As shown in FIG. 12, the exposed second metal layer 15 is applied with the etching process to expose the ion injection layer 14. The exposed ion injection layer 14 is further applied with the etching process to expose the semiconductor layer 13.

Figure 13:
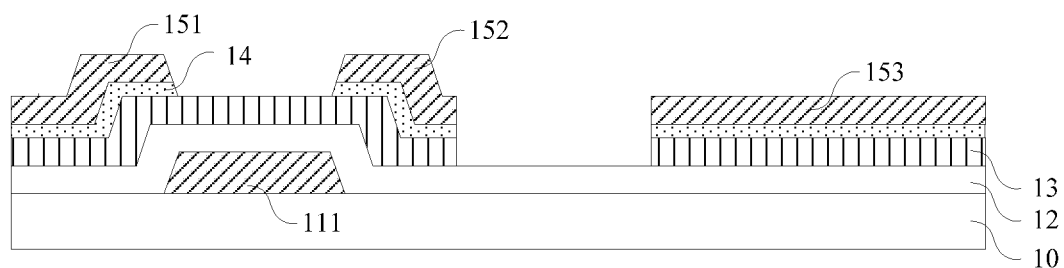

As shown in FIG. 13, the photoresist glue on the second metal layer 15 is peeled off to form the array substrate, wherein the second metal layer 15 is etched to form the source 151, the drain 152, and the pixel electrode 153.

It is to be noted that, in the above manufacturing process, the source 151, the drain 152, and the pixel electrode 153 are formed by the same metal layer, i.e., the second metal layer 15, and only one mask is adopted.

Figure 14:
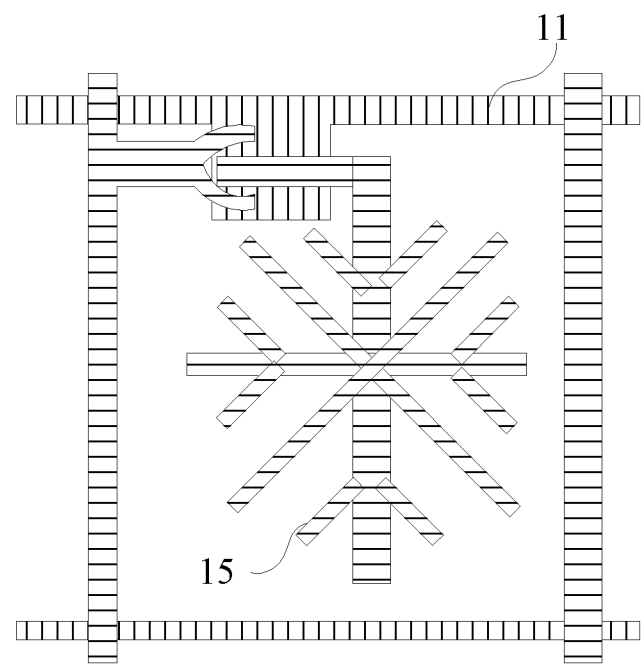
FIG. 14 is a top view of the manufacturing method of the array substrate in accordance with one embodiment of the present disclosure.

As shown in FIG. 14, the region filled with vertical lines represents the pattern of the first metal layer 11, and the region filled with horizontal lines represents the pattern of the second metal layer 15.

In view of the above, a first metal layer is formed on a substrate; adopting a first mask to etch the first metal layer to form a gate; a gate insulation layer, an active layer, and a second metal layer is formed on the first metal layer in sequence; adopting a second mask to etch the second metal layer and the active layer to form a source, a gate, and a pixel electrode. In this way, only two masks are needed in the manufacturing process of the array substrate, which enhances the efficiency of the manufacturing process and reduces the cost of the product.

Figure 15:
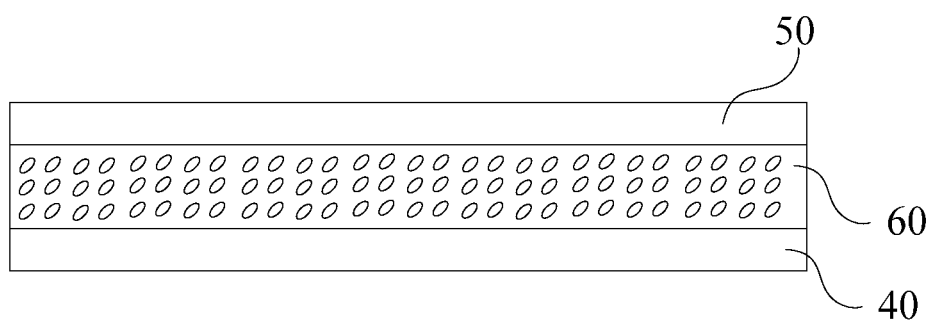
FIG. 15 is a schematic view of the liquid crystal panel in accordance with one embodiment of the present disclosure.

FIG. 15 is a schematic view of the liquid crystal panel in accordance with one embodiment of the present disclosure. The liquid crystal panel includes an array substrate 40, a CF substrate 50, and a liquid crystal layer 60 between the array substrate 40 and the substrate 50.

The array substrate 40 includes the array substrate in the above embodiment, wherein the second metal layer, including the source, the drain, and the pixel electrode are exposed within the liquid crystal layer 60. Thus, the second metal layer has to be configured with the metal which is difficult to oxidize, such as the metal, i.e., Ag or a combination of Ag and Mo, of multi-layer.

The substrate 50 is configured with a photoresist and the common electrode. Specifically, the photoresist may include RGB three-color photoresist. The electric field is formed between the common electrode and the pixel electrode of the array substrate so as to control the alignment of the liquid crystal molecules.

Specifically, the liquid crystal panel is the VA liquid crystal panel.

The present disclosure also relates to a VA LCD, including a liquid crystal panel and a backlight, wherein the liquid crystal panel may be the above-mentioned panel.

In view of the above, the first metal layer of the array substrate is etched to form the gate by the first mask, and the second metal layer is etched to form the source, the drain, and the pixel electrode by the second mask. Only two masks are adopted in the manufacturing process. Thus, the manufacturing process is enhanced, and the cost of the product is reduced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A manufacturing method of an array substrate for a liquid crystal display panel, comprising:

forming a first metal layer on a substrate;
adopting a first mask to etch the first metal layer to form a gate;
forming a gate insulation layer, an active layer, and a second metal layer on the first metal layer in sequence; and
adopting a second mask to etch the second metal layer and the active layer to form a source electrode, a drain electrode, and a pixel electrode,
wherein the liquid crystal display panel comprises a color filter (CF) substrate and a liquid crystal layer arranged between the array substrate and the CF substrate; and
the source electrode, the drain electrode and the pixel electrode are configured to be directly exposed within the liquid crystal layer.

2. The manufacturing method as claimed in claim 1, wherein the second metal layer is an anti-oxidant metal material.

3. The manufacturing method as claimed in claim 1, wherein:
the step of adopting a first mask to etch the first metal layer to form a gate further comprises:
coating photoresist glue on the first metal layer;
applying an exposure and a development process to the photoresist glue by the first mask; and
etching the first metal layer to form the gate.

4. The manufacturing method as claimed in claim 1, wherein the step of forming a gate insulation layer, an active layer, and a second metal layer on the first metal layer in sequence further comprises:
forming the gate insulation layer on the first metal layer;
forming a semiconductor layer on the gate insulation layer, and injecting ions on a surface of the semiconductor layer to form an ion injection layer; and
forming a second metal layer on the ion injection layer.

5. The manufacturing method as claimed in claim 4, wherein the step of adopting a second mask to etch the second metal layer and the active layer to form a source, a drain, and a pixel electrode further comprises:
coating the photoresist glue on the second metal layer;
applying the exposure and the development process to the photoresist glue by the second mask;
etching the second metal layer, the semiconductor layer, and the ion injection layer to form the source, the drain, and the pixel electrode.

6. The manufacturing method as claimed in claim 5, wherein:
the photoresist glue being applied with the exposure and the development process covers the corresponding gate;
etching the second metal layer, the semiconductor layer, and the ion injection layer to expose a portion of the gate insulation layer, and the portion being not covered by the photoresist glue;
digging a hole on the photoresist glue to expose the portion of the second metal layer, and the portion being covered by the photoresist glue;
etching the exposed portion of the second metal layer to expose the ion injection layer;
etching the exposed portion of the ion injection layer to expose the semiconductor layer.

7. The manufacturing method as claimed in claim 6, wherein:
the step of etching the second metal layer, the semiconductor layer, and the ion injection layer to expose a portion of the gate insulation layer, and the portion being not covered by the photoresist glue further comprises:
applying a wet etching process to the second metal layer to expose the ion injection layer; and
applying a dry etching process to the ion injection layer and the semiconductor layer to expose the gate insulation layer.

* * * * *